United States Patent [19]
Hildenbrand et al.

[11] Patent Number: 5,097,127
[45] Date of Patent: Mar. 17, 1992

[54] MULTIPLE DETECTOR SYSTEM FOR SPECIMEN INSPECTION USING HIGH ENERGY BACKSCATTER ELECTRONS

[75] Inventors: Walter W. Hildenbrand, Brewster; Steven G. Utterback, Peekskill, both of N.Y.

[73] Assignee: IBM Corporation, Armonk, N.Y.

[21] Appl. No.: 744,834

[22] Filed: Aug. 13, 1991

Related U.S. Application Data

[63] Continuation of Ser. No. 484,718, Feb. 23, 1990, abandoned.

[51] Int. Cl.⁵ .......................................... H01J 37/252
[52] U.S. Cl. ................................... 250/310; 250/305; 250/397
[58] Field of Search .................. 250/310, 397, 305

[56] References Cited

U.S. PATENT DOCUMENTS 4,179,604 12/1979 Christou ............................. 250/305
4,818,874 4/1989 Ishikawa ............................. 250/310

OTHER PUBLICATIONS

Jackman, Industrial Research and Development, vol. 22, No. 6, Jun. 1980, pp. 115-120.

Primary Examiner—Jack I. Berman
Attorney, Agent, or Firm—Sughrue, Mion, Zinn, Macpeak & Seas

[57] ABSTRACT

An inspection system employing high collection efficiency energy filtered backscatter electrons. At least two detectors are positioned relative to the sample at spaced locations. Each detector has a canister with a fiberoptic bundle mounted therein. A scintillator detector is mounted at the end of the fiberoptic bundle. A ground grid is mounted at an opening of the canister in axial alignment with the scintillator detector. An energy filter is interposed between the scintillator detector and the ground grid. The energy filter is an electrostatic retarding potential grid to permit detection of only high energy backscatter electrons. The geometry of the detectors relative to the specimen together with the conical shape of the detector housing achieves maximum collection efficiency of the targeted electrons.

14 Claims, 6 Drawing Sheets

MULTIPLE DETECTOR SYSTEM FOR SPECIMEN INSPECTION USING HIGH ENERGY BACKSCATTER ELECTRONS

This is a continuation of application Ser. No. 07/484,718 filed Feb. 23, 1990.

BACKGROUND OF THE INVENTION

This invention relates to an apparatus for the inspection of features on semiconductor devices to provide topographical data for purposes of specimen analysis.

The use of scanning electron microscopes (SEM) as a tool for the purpose of evaluating topographical features on semiconductors is well documented in the literature. Reference is made to Wells, et al, "Method for Examining Solid Specimens with Improved Resolution in the Scanning Electron Microscope (SEM)", Appl. Phys. Lett., vol. 23, No. 6, pp. 353-354 (September 1973); Wells, "Low-Loss Image for Surface Scanning Electron Microscope", Appl. Phys. Lett., vol. 19, No. 7, pp. 232-235 (October 1971); Utterback, "Semiconductor Dimensional Metrology using the Scanning Electron Microscope", Review of Progress in Quantitative Nondestructive Evaluation, vol. 7B, pp. 1141-1151, Plenum Press (1988).

In general, by the use of a SEM, an electron beam impinges on a specimen surface under examination. Details of the specimen surface are obtained by using detectors to detect either backscatter electrons or secondary electrons generated by the specimen surface. Normally, the E beam is focused to a fine spot by means of the microscope optic-electronics and it is then caused to scan the surface of the specimen. By various imaging techniques in conjunction with computer of the scanning pattern, a detailed examination of the topography of the specimen is obtained.

Also within the patent literature are a number of schemes using SEM techniques for purposes of testing specimens. Reference is made to U.S. Pat. No. 3,539,999 which uses a series of slotted plates, which are operated at a potential such that optimal secondary electron collection is insured. U.S. Pat. No. 3,714,424 employs a standard secondary electron detector with a collection grid electrically coupled to the stage. This system decreases electron current by an applied electric field to insure that only low energy secondary electrons will reach the detector. U.S. Pat. No. 4,011,450 also uses an applied electric field as an auxiliary electrode to increase secondary electron intensity and contrast for purposes of inspection of a sample. By using two or more collection electrodes, this scheme creates electric fields to pull electrons from the sample and push them toward the detector.

The collection of secondary electrons is also disclosed in U.S. Pat. No. 4,442,355. In that patent an in-lens secondary electron detector has a pipe electrode concentric with the beam axis. The electron microscope employs a grid to produce an accelerating field for secondary electrons. The scheme guides electrons without perturbing the beam. U.S. Pat. No. 3,736,424 also collects secondary electrons and the detection is enhanced by generating a filtering dielectric field at the sample. A specimen current detector is electrically coupled to the stage.

Difficulties in secondary electron detection are also dealt with in U.S. Pat. No. 4,743,757. Uneven detection is eliminated by the use of a split grid which is interposed between the specimen and the scintillator. An alternative grid technique is suggested in U.S. Pat. No. 4,596,929, which employs a pair of grids to improve detection efficiency by attracting electrons to the detector.

U.S. Pat. No. 3,646,344 also relates to an SEM specimen inspection scheme utilizing three grids to form a potential barrier of adjustable height for purposes of discriminating electrons emanating from regions of different potential at the specimen. As such, the scheme disclosed is an energy-filter detector. It defines a so called "window" which passes electrons, but employs a filter grid, which is biased to a potential above that of the beam. Thus, the presence of such a filter grid precludes electrons passing through to the detector element. The system employs a single detector with the scintillator held at ground. The system employing three grids physically extends below the sample surface and does not offer any adjustability in position. It will not work as a secondary electron detector and will not work at voltages below about 10 keV.

Importantly, the system is unsuitable for quantitative measurements. This is because the displacement of the scintillator from the filtered-sample access results in a nonuniform electron detection over the energy band width and collection angle. Thus, the system is not configured to function in an environment requiring three dimensional metrology.

U.S. Pat. No. 4,179,604 deals with the collection and detection of backscatter electrons and allows for the discrimination of detected electrons on the basis of their energy. This scheme permits the collection of low loss electrons and provides for improved energy discrimination. The scheme however is predicated on an erroneous assumption that electrons will be able to pass through a filter grid that is biased to a potential that actually exceeds that of the beam itself. This is impossible. Further, the patent indicates that the system could be constructed employing a filter grid with 400 mesh. Such a grid, however, would reduce the number of electrons that could pass by a factor of approximately 75%. Moreover, in this system the detector extends below the surface plane of the sample and is not designed for use in spatial discrimination of electron take-off angle. A single element detector is disclosed and consequently, the system cannot be used for stereophotometric imaging. The position of the detector is not adjustable and the detector element is always held at ground. Thus, the system cannot be used as a secondary electron detector. It also cannot be used for making three dimensional measurements of intact wafers at beam voltages below 10 keV.

While the art defines a variety of schemes advancements in techniques of sample inspection have not matched development of semiconductors of ever decreasing size. As semiconductor minimum features sizes shrink to below 0.5 $\mu$m non-optical inspection techniques such as SEM must play an increasingly important role in the inspection and measurement of semiconductor wafers. With those very small feature sizes prior optical inspection techniques simply cannot provide sufficient resolution for reliable inspection. However, SEM techniques, as discussed herein, have a unique set of challenges and drawbacks. For example, due to the uncertainty in the origin of detected electrons in ordinary secondary electron imagining of surface structures, particularly in the vicinity of features edges, the ability to make accurate measurements is compromised to an unacceptable extent. Also, the use of an SEM poses physical constraints on the size of a sample that can be inspected without repositioning either the stage or the sample.

FIG. 1 illustrates positioning of conventional detectors relative to a specimen and the generation of both secondary electrons and backscattered electrons. FIG. 1 illustrates the conventional placement of elements for SEM detection. A pole piece of the SEM provides focusing for a primary electron beam (PE). The beam impinges on the surface of a specimen 10 having topographical features 12 such as metalization or trenches. The radius of the primary beam (PE) is illustrated in FIG. 1 by the radius (R). The impingement of the primary beam (PE) results in both a secondary electron emission from the specimen 10 and also the generation of backscattered electrons.

Secondary electron emission and the paths of those electrons is illustrated by lines SE-I, SE-II, and SE-III. Note also the generation of secondary electrons SE-IV from the SEM optics. Additionally, backscattered electrons are produced from the surface and illustrated as BSE-Is and BSE-II. The backscattered electron emission BSE-II produces, when those electrons strike the pole piece not only a reflected backscattered, BSE-III but also, a tertiary secondary electron SE-III. Reference is made to Peters, K. W. R. (1984) "SEM Contrast at High Magnification" in Microbeam Analysis—1984, ed, A. D. Romig, Jr. and D. B. Williams (San Francisco Press) pp. 135-139 which discusses electron discrimination and in particular Backscatter Is electrons. These electrons are also known as "Low-loss" or "no-loss" electrons since they do not have scattering events prior to detection. In that regard, Wells, O. C. (1971), "Low-loss Image for Surface Scanning Electron Microscope", API, 19, 232-23 and Reimer, L. (1985), "Scanning Electron Microscopy" Springer-Verlaz (Springer-Verlag, Berlin Heidelberg), 139-142 discusses the characteristics of this specie of electrons. The problem of discrimination and collection of those electrons by a secondary electron detector, as illustrated in FIG. 1, is to discriminate between those secondary electrons generated by the specimen and those emanating from other factors. This is an unresolved problem in the art. While electron-material interaction modeling can help alleviate this difficulty, it is limited by the applicability of the energy loss equations the models must invariably employ. In the case of electron interactions with organic materials such as a photoresist, the equations are not generally sufficiently accurate. Moreover, effects such as substrate charging can affect penetration in ways which cannot be reliably predicted.

A more satisfactory approach to solving the problem is to develop electron detection techniques which eliminate the uncertainty in the origin of the detected electrons. For example, it would be highly desirable to selectively exclude electrons which penetrate through the sidewall of a feature such as a micro circuit line, i.e., exclude all electrons except those illustrated in FIG. 1 as BSE-Is, the low-loss or no-loss electrons. If this could be done then, it would be easier to determine where the true edge of that feature is located. The desirability of such techniques has been suggested by Utterback in "Semiconductor Dimensional Metrology Using the SEM", supra and by Rosenfield, "Analysis of Line Width Measurement Techniques Using the Low Voltage SEM", SPIE 775, 70, (1987). Filtering backscatter electrons for improved resolution was suggested very early in McMullen (1953), "An Improved Scanning Microscope for Opague Specimens", Proc. Inst. Elec. Eng. (London) Pt. B 100 245-259.

Despite such suggestions of principles and theory, there remain in the art unresolved technical deficiencies which have precluded the practical application of such concepts in the setting of semiconductor inspection during fabrication as an on-line, operative scheme.

SUMMARY OF THE INVENTION

Given these deficiencies in the prior art it is an object of this invention to provide for improved SEM techniques which are usable at submicron ground rules.

Yet another object of this invention is to provide for a detector system which provides energy filtered detection for obtaining two dimensional data for sample inspection.

A further object of this invention is to provide for a multiple detection system utilized in the SEM which is both small and adjustable for near surface detection.

Yet another object of this invention is to provide a multiple detector system for surface topography dimensional metrology.

These and other objects of this invention are obtained by utilizing SEM techniques by employing a recognition heretofore undefined in SEM measurement technology. Specifically, it has been recognized that injected high energy probe electrons lose energy continually as they travel through a material. Injected electrons which travel further through the target prior to escaping will have less residual energy than other electrons. Thus, by energy filtering the detected backscatter electrons it is possible to detect only those electrons which have penetrated the target a limited distance before scattering and escaping to the detector.

This makes it possible to exclude from detection electrons of unknown origin such as those which penetrate the side wall. It further provides the capability of accurate edge location by virtue of the multiple detector configuration. Energy filtering in accordance with this invention is accomplished by the placement of an electrostatic retarding potential grid in front of a series of backscatter electron detectors. The detectors themself have a large collection solid angle to assure maximum collection efficiency and enhance signal-to-noise ratio.

Thus, as will be appreciated while those working in the SEM field generally recognized that low loss backscatter electrons (BSE-I) could provide greater surface detail by virtue of reduced electron penetration, the goal of a system achieving that desire has not been achieved prior to this invention. Further, the body of prior art did not recognize how BSE-Is could be used to provide for a very accurate means of determining the location of structural edges. This invention thus applies BSE-1 detection to semiconductor metrology by considering:

(1) The need for equivalent detector response to all electrons entering a capture window regardless of energy or trajectory.

(2) The size requirement imposed by large specimens.

(3) The adjustable placement requirement to solve problems of interference with the sample and the relative configuration of the detector to the sample for purposes of optimizing the information content of the detected signal.

(4) The multiple detector approach to provide balanced signals and allowing for both maximum signal acquisition and optimum detector placement with respect to each of the two edges of a measured line or trench.

An important aspect of this invention is therefore the solution of a problem uniquely associated with semiconductor specimens. Specifically, in such structures the presence of insulating layers can result in surface charges that make it impossible to perform measurements at arbitrary electron beam voltages. In some techniques now under consideration, measurements must be made at the cross-over point when using secondary electron detection. However, in the case of semiconductor layers, while this surface charge is sufficient to create distortions in secondary electron images, the insulating properties of these layers are such that it is impossible for the charge to build up to a high enough potential to perturb the electron beam itself.

However, with this invention it is possible to make measurements at any voltage desired, regardless of cross-over voltage, without introducing distortions to the image. This in turn allows the use of higher beam voltages which provides material advantages over prior art SEM-based measurement systems. For example, the beam is more stable and the resolution is improved. By this invention the problem of automating an SEM measurement system is simplified because it is no longer necessary to "tune" the beam voltage to the sample in order to find the cross-over. Rather, any desired voltage may be employed for any and all measurements.

This invention will be described in greater detail by referring to the attached drawings and the description of the preferred embodiments which follow.

DESCRIPTION OF THE PREFERRED EMBODIMENT

Figure 1:
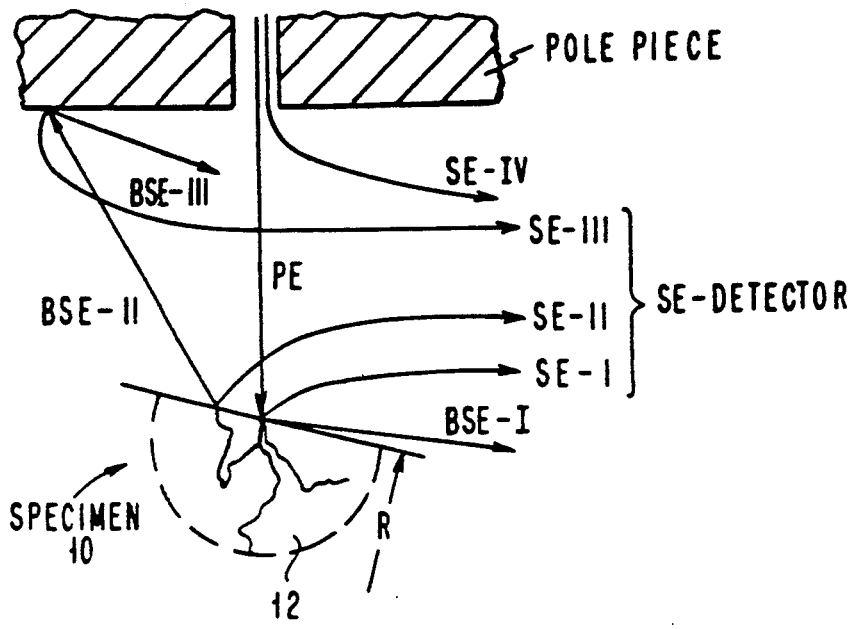
FIG. 1 is a schematic illustration of a prior art SEM detection system illustrating the generation of secondary electrons and the paths of such electrons and back-scattered electrons from a specimen.
Figure 2:
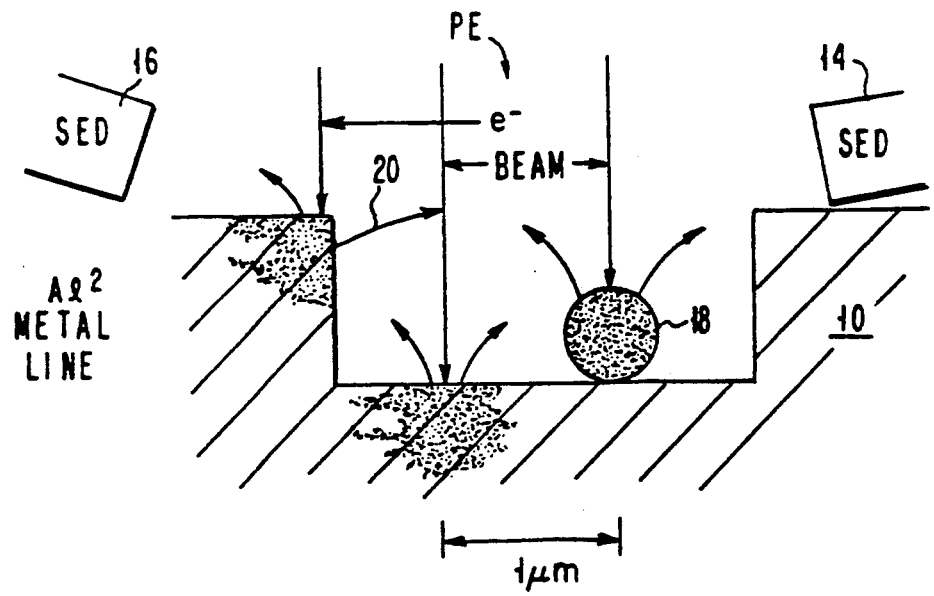
FIG. 2 is a schematic side view illustrating specimen geometries and the generation of secondary electrons and back-scatter electrons.

Referring now to FIG. 2, a side view of a portion of a specimen 10 is depicted and, in particular, a metal line typically aluminum having a cross sectional side wall. A pair of secondary electron detectors 14, 16 are illustrated in FIG. 2.

As illustrated in FIG. 2, the primary beam (PE) has a width in the range of 0.1 $\mu$m. As that beam impinges on the topography of the specimen, backscatter electrons, as illustrated by 18, will be generated as the beam scans the features. Additionally, secondary electrons 20 will be generated from the specimen surface. In accordance with this invention, no-loss, that is, high collection-efficiency energy-filtered backscatter electrons (BSE-I) will be detected by a system which is positioned above a full wafer specimen. The specimen may be tilted relative to the detection system, typically 45°. Moreover, as will be pointed out herein, by replacement of certain elements, the detection system may be used as a secondary electron detector with fiber optic focusing which can be positioned in an adjustable manner over the entire specimen. Since multiple detectors are used, the system may be used in either a backscatter or secondary electron detection mode by employing those independently configured detectors to enhance signal strength and contrast.

Figure 3:
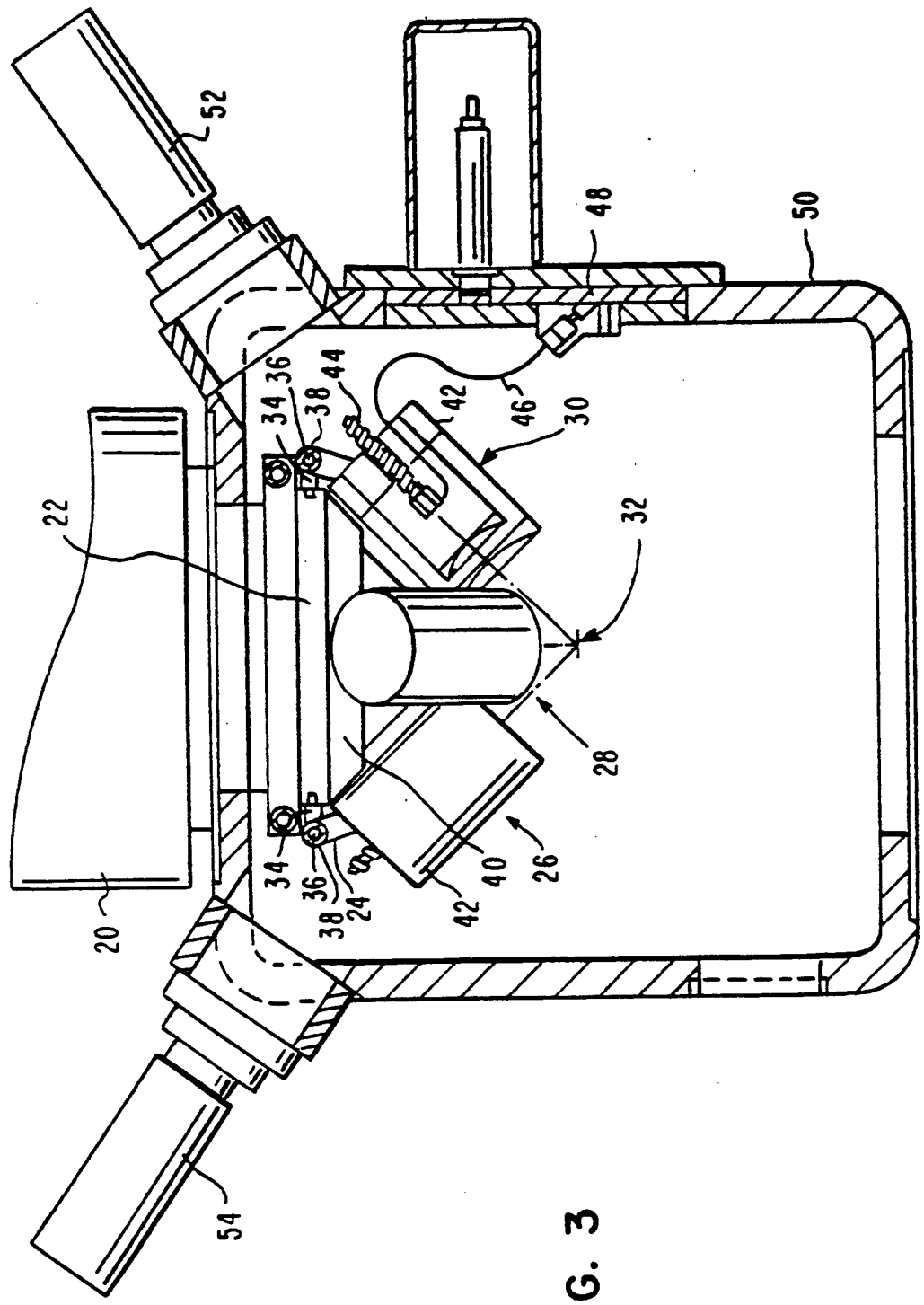
FIG. 3 is a schematic drawing illustrating the system of a first embodiment of this invention.

FIG. 3 illustrates a first preferred embodiment of this system. The SEM column 20 has mounted to it a mounting collar 22. That collar, mounted to the SEM objective lens, has an adjustable detector arm 24.

The adjustable detector arm 24 provides mounting locations for three detectors 26, 28, and 30. The target focus 32 on the specimen, not shown, is illustrated in FIG. 3.

The adjustable detector arm 24 comprises a coupling 34 joining the arm 24 to the collar 22. Protruding from the coupling is a ball 36 having a compatible socket 38 on the end of the arm 24. This ball and socket arrangement 36, 38 permits rotation and 3 degrees of freedom for positioning each of the detectors 26, 28, and 30. While detailed relative to only one arm 24, it will be understood that each arm is similarly constructed.

The collar 22 has a chamfer surface 40 angled to permit each of the detectors to be directed inwardly toward the target focus 32.

Figure 4:
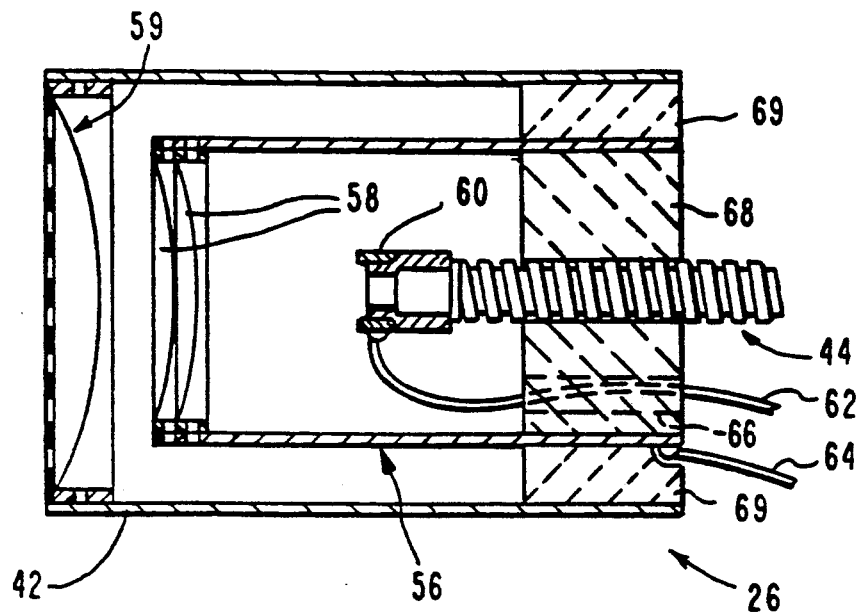
FIG. 4 is a schematic illustration of one of the detectors used in the first embodiment of this invention.
Figure 5:
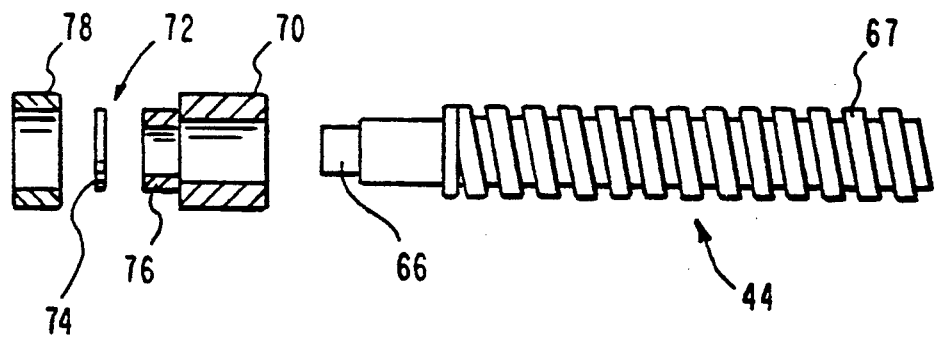
FIG. 5 is an exploded side view of the fiber optic detector used in accordance with the first embodiment of this invention.

The detectors 26, 28 and 30 are illustrated in greater detail in FIGS. 4 and 5. Schematically, as illustrated in FIG. 3, they comprise a detector housing 42 having therein a sheath fiber optic bundle 44. A high voltage connector 46 provides the necessary voltage input to the detector from a terminal 48 in the outside wall of the housing 50.

The assembly is completed by having a pair of photomultiplier tubes 52, 54 mounted as illustrated in the assembly of FIG. 3. One photomultiplier is switched between two detectors 26, 30 while the other is dedicated to the centerline detector 28.

Referring now to FIGS. 4 and 5, the details of the detectors in accordance with this first preferred embodiment invention are illustrated. FIG. 4 illustrates one of the detectors 26 and FIG. 5, the sheath fiberoptic bundle 44. Referring first to FIG. 4, each of the detectors comprises a grounded shield cover 42 having at a position concentrically therein an energy filter 56. A series of mesh tungsten screens 58 are positioned in front of a scintillator 60. A sheathed fiberoptic bundle 44 is placed in axial alignment with the mesh tungsten screens 58 and the scintillator 60 disposed annularly about the electron collector end.

As illustrated in FIG. 4, the energy filter comprises a concentric stainless steel cylinder 56 which fits over the fiberoptic bundle 44 by the use of the insulating spacer 68. The open end of the cylinder is covered by means of two 100 mesh tungsten screens 58. Preferably, those two screens are separated by one mil. As illustrated in FIG. 4 they have two different curvature radii, 2.4 and 2.5 inches. This acts as an electron filter when it is charged to an appropriate retarding potential. The outer cylinder 42 fits over the inner cylinder 56 by means of an insulating spacer 69. Its open end is covered with a single 100 mesh tungsten screen 59 having a radius of curvature of 2.0 inches.

High voltage connectors are used to provide a coupling to the scintillator 60 and the energy filter 56 respectively. The high voltage connector 62 passes through a tunnel 66 in the insulator 68 for the fiberoptic bundle 44. The voltage connections to both the scintillator 60 and the inner energy filter 56 are made through a Ceramaseal high voltage hermetic feed through, illustrated in FIG. 3 as element 48.

FIG. 5 illustrates one of the detector elements 44. It comprises a fiberoptic bundle 66 mounted in a rigid sheath 68. An annular teflon sheath 70 is slidably mounted over the end of the fiberoptic bundle 66. As illustrated in FIG. 5, the internal geometry of the sheath 70 is compatible with that of the bundle 66. A quartz wafer 72 having an aluminum coated phosphor 74 on one surface is placed on the end 76 of the teflon sheath 70. A HV electron collector 78 slidably fits over the end of the teflon sheath 70 thereby positioning the quartz wafer 72 in place. Thus, as illustrated in FIG. 5, the fiber optic bundle 66, in its sheath 68, has mounted thereon the teflon sheath 70 which carries with it the quartz wafer 72 and the HV electron collector 78.

With the arrangement illustrated in FIG. 5 the end of the fiber optic bundle carries a high voltage electron collector such that it acts as a scintillator for a secondary electron detector.

Figure 6:
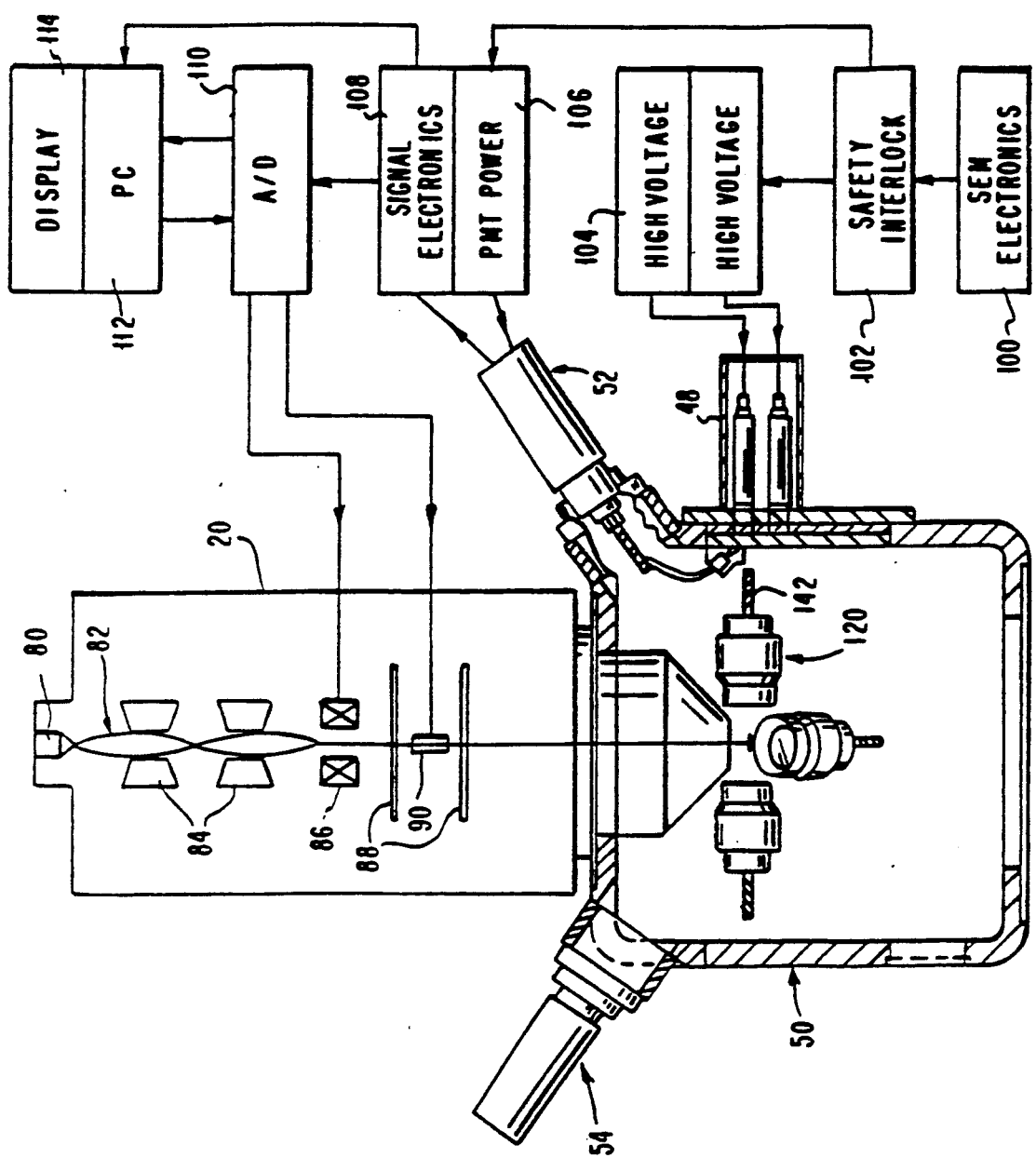
FIG. 6 is a schematic drawing illustrating the system of a second preferred embodiment of this invention.

Referring now to FIG. 6, a second preferred embodiment of this invention is depicted. It will be understood by those of working in this technology that this embodiment departs from that of FIG. 3 in the placement of the detectors. As will be explained herein the details of the SEM and its associated electronics are identical for both FIG. 3 and the second preferred embodiment illustrated in FIG. 6.

The SEM column 20 has an electron gun 80 which produces an electron beam 82. The beam 82 passes through two condensing lenses 84 which tend to converge the beam as it then passes through scan coils 86. The electron beam 82 is deflected by the scan coils and passes through a pair of apertures 88 positioned between blanking rods 90. Those aspects of SEM technology are well known in this field and are provided as background, not forming a part of this invention.

The housing 50, which is evacuated, supports a pair of photomultiplier tubes (PMT) 52 and 54 positioned as illustrated in FIG. 6. While the electronics are illustrated in FIG. 6 relative to the PMT 52 it will be understood by those of working skill that similar couplings also are used for PMT 54.

The scanning electron microscope electronics 100 provide control functions including a safety interlock 102 to prevent inadvertent powering to the system. A pair of high voltage couplers 104 provide the necessary input to the PMT's 52 and 54 via the Ceramaseal high voltage hermetic feedthrough 48. Power is applied to PMT's 52 and 54 via an adjustable power source 106. The outputs of the two PMT's, which are switchable, are supplied to signal electronics 108 which provides output signals in turn to an analog to digital converter 110 and to a computer 112.

In the second preferred embodiment, one photomultiplier is switched between two detectors while the other is dedicated to the in-line detector forming the third detector in the system.

The analog to digital converter 110 receives instructions from the computer 112 and in turn provides signals to the scan coil 86 and the blanking rods 90 for purposes of beam steering and blanking. By this technique, the beam 82 is caused to scan over the surface of the sample in a manner under computer control. A display 114 is used to provide a visual output of parameters, as required.

FIG. 6 illustrates modified detectors and a modified placement scheme in the second preferred embodiment. The first preferred embodiment mounted the detectors on a collar which in turn was mounted to the SEM column. In this embodiment the detectors are mounted to the housing wall by means of mounting brackets.

Figure 7:
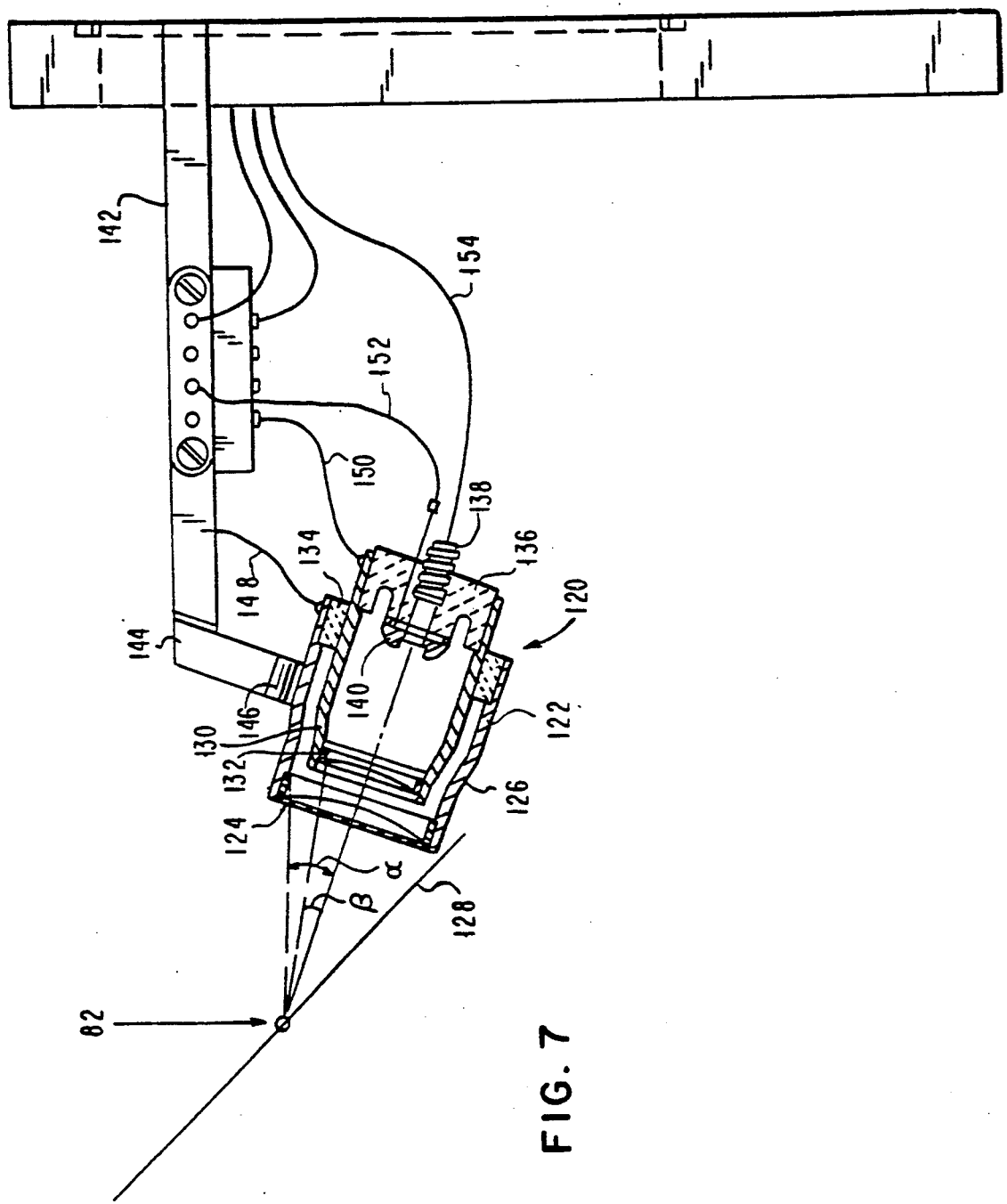
FIG. 7 is a schematic illustration of one of the detectors used in the second preferred embodiment of this invention.

Reference is made to FIG. 7 which illustrates not only the modified detector but also the modified mounting position. In FIG. 7 the detector 120 has an outer cylindrical metallic canister 122 which supports a ground grid 124. The outer container has a conical transition section 126 to allow placement of the detector at a point closer to the surface of a specimen 128.

A concentric inner canister 130 supports an energy filter grid 132. The inner and outer canisters 122 and 130 have conformal geometries and are separated by means of an insulator spacer 134.

An insulator 136 supports the fiberoptic light pipe 138 having a scintillator detector 140. Details of this electron collector and fiberoptics will be explained relative to FIG. 8.

In FIG. 7, the detectors are mounted to the wall of the vacuum chamber by means of a projecting beam 142 having at one end a section 144 which rotates relative to section 142. The detector 120 is mounted on section 144 and may be adjusted by means of a swivel 146 so that by combined action of the section 144 and the swivel 146 the detector 120 can be appropriately positioned. Feedthrough electrical couplings 148 and 150 for the inner and outer canisters are illustrated in FIG. 7 together with the electrical feedthrough 152 for the scintillator detector and to the chained line 154 for the fiberoptic bundle 138.

FIG. 7 also illustrates the electron detector capture angle. As set forth in this invention, a primary purpose is to operate in an energy filter mode for capturing electrons in the 0–200 eV electron energy band width. The electron beam 82 impinges on a sample 128 at a focal point marked in FIG. 7. As is conventional in the industry, the sample 128 is held on a stage in an angular orientation to the detectors. Typically the sample 128 is positioned at an angle of 45°. No loss backscatter electrons, that is those electrons that have not had a significant number of scattering events (BSE-I) are deflected from the sample surface to the detector 120. The ground grid 124 is configured to provide a capture angle of approximately 28° this is illustrated in FIG. 7 as the angle $\alpha$. The energy filter grid is configured in the internal annular detector to have a capture angle of approximately 14° ($\beta$) off the center line of the detector as illustrated in FIG. 7. The second preferred embodiment of this invention as illustrated in FIG. 7 allows the detector to be placed very close to the horizon of the sample surface. This enhances collection efficiency for high energy backscatter electrons.

Figure 8:
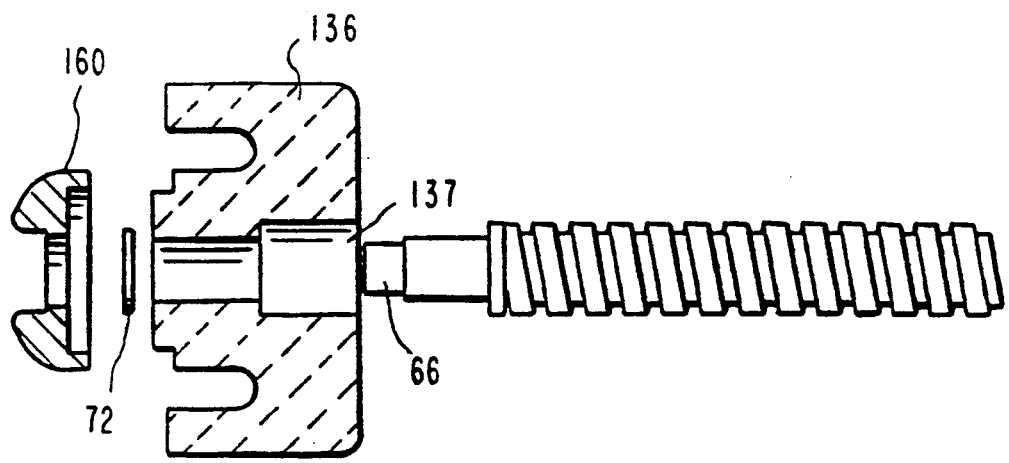
FIG. 8 is an exploded side view of the fiber optic detector used in accordance with the second preferred embodiment of this invention.

Referring now to FIG. 8 the modified energy-filter electron detector components are illustrated. As in FIG. 5, a fiberoptic bundle 68 is employed that mounts on an insulator 136. The insulator has a through-hole 137 with two different bores to fit the front end of the fiberoptic bundle. An aluminum coated phospher on quartz wafer 72 is placed on the end of the fiberoptic bundle. An HV electron collector 160 holds the wafer 72 onto to the fiberoptic bundle 68 and fits in a conformal manner over the insulator 136.

As illustrated in FIG. 8 the collector 160 is a different configuration from the collector 78 in FIG. 5. This bullnose pattern of the scintillator cap piece 160 tends to pull electrons onto the face of the scintillator. This cross-section configuration having the tapers illustrated in FIG. 8 provides for improved electron count and signal intensity to enhance collection efficiency which is used for modelling the physical profile of the sample. As in the embodiment of FIG. 3 of the fiberoptic bundle 68 is used for purposes of focussing the system on the sample surface.

Figure 9:
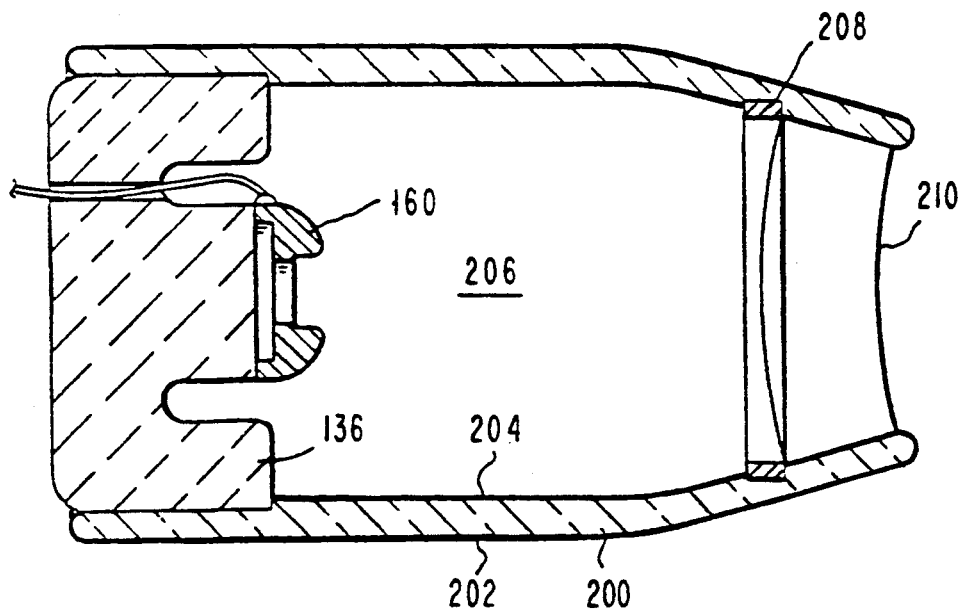
FIG. 9 is a schematic side view of a third preferred detector in accordance with this invention.

Referring now to FIG. 9 a modified third embodiment of this invention is depicted. This embodiment differs from that of FIG. 7 in so far as the construction of the detector housing is concerned. It will be understood that the fiberoptic bundle mounted in the insulator 136 having the bullnose high voltage electron collector 160 is the same as that in FIG. 8. This invention departs from FIG. 7 in that it employs only a single canister. That canister 200 is made of an insulative material such as glass or Kevlar (TM). This insulative material 200 acts as a substrate for a pair of metallic coatings 202 and 204 on inner and outer surfaces. The interior 206 is maintained under vacuum conditions. An energy filter grid 208 is placed inside the canister with the ground grid 210 at the entrance. The ground grid 210 is electrically coupled to the inner metallic wall 204 while the energy filter grid 208 is coupled to the housing via the insulative material 200. Consequently, grids 208 and 210 are maintained in electrical isolation relative to each other.

The embodiment of FIG. 9 has in inward conical configuration at the forward end thereof which allows for alignment with the wafer surface at an angle of approximately 5° off the wafer surface. This further increases maximum electron capture, for example, 200 ev in the case of silicon. The internal optics of the embodiment of FIG. g are identical to those of FIG. 7.

In operation, the system, for example that of FIG. 6, is started in a manner conventional with customary use of SEM systems. In accordance with this invention the detectors are first operated in secondary electron detection mode for purposes of tuning the SEM. The inner and outer containers 122 and 130 are coupled together with a positive voltage so that the system initially becomes an efficient secondary electron detector. For energy filtering the two detectors are separated and a potential difference between the inner filter and the scintillator is maintained at 12 KV. Data acquisition proceeds utilizing the two PMT's 52 and 54 with one of the two switched between two of the detectors. The computer 112 performs data handling management.

In order to avoid distortions in output, the sample scan cannot be at high rates since, if the scanning rate is too high, the detector and electronics will lag. Thus, in accordance with this invention the scan speed is slowed to a speed related to the response speed of the detectors, preferably to a speed resulting in less than one percent distortion of the image. This scan speed is controlled by inputs to the scan coils 86 from the computer 112 through the analog to digital converter 110. The scan speed is slowed so that it is less than the accumulated time constant of the detector electronics. The overall time constant is determined by the use of a signal filter having an appropriate time constant, typically in the range between 3 usec. and 10 msec.

Another advantage of a slower scan rate is that it allows measurements at discrete steps rather than measurements which lag in time between the beam position where such measurements were taken and where the measurement is recorded due to the inherent time differential. Thus, this invention eliminates the problems in the prior art where there were distortions in measurements given the differential and beam scanning rate and detector electronics.

Thus, as described herein, this detection scheme provides for a combination of multi detectors provided above the sample plane to provide for greater sample inspection and provide at least 2-dimensional data. With this invention edge detection of specimen features is enhanced because of the geometrical relationship between the structure, the beam and the detectors. Specimen topography typically includes trenches and sidewalls that are inclined. It is important to measure both the top and bottom edges of such structures. A single detector cannot, however, measure the location of both top and bottom edges. Using this invention one detector measures the defined top edge while the bottom edge is defined and measured by the second detector. The measurement points from the two detectors thereby accurately define the topography. While a three detector system is illustrated, four or more detectors may also be used.

It is apparent that modifications of this invention may be practiced without departing from the essential scope of this invention.

Having described our invention, we claim:

1. A system for inspecting a semiconductor specimen comprising; a scanning electron microscope for producing an electron beam directed on to a surface of said specimen to produce high energy backscatter electrons from said specimen; at least two detectors positioned at spaced positions relative to said specimen and having openings directed toward said specimen to receive and collect said high energy backscatter electrons; each of said detectors comprising a housing having a fiberoptic means mounted in said housing, a scintillator detector mounted at an end of said fiberoptic means projecting into said housing, a ground grid positioned in said opening and axially aligned with said scintillator detector, and an energy filter grid axially aligned with said ground grid so that said detectors collect said high energy backscatter electrons, wherein each of said detectors comprises an outer tapered conical cylindrical housing with an axial aligned opening and an annular inner tapered conical cylindrical housing having a taper conformal and axially aligned opening with that of said outer housing, said outer and inner housings spaced by an insulator, said ground grid mounted to said outer housing and said energy filter grid mounted to said inner housing at one end thereof, said inner housing having an insulator at an opposite end thereof and means for mounting said fiberoptic means.

2. The system of claim 1 wherein each of said scintillator detectors comprises a high voltage electron collector mounted in alignment with said fiberoptic means, said collector having a tapered mounted face for electron collection and a thru-hole to provide an optical window from said fiber optics.

3. The system of claim 1 wherein each of said detectors comprises a single cylindrical housing said housing comprising an insulating material having metallic coatings on inner and outer surfaces thereof, said ground grid mounted to said housing on said inner metallic surface and said energy filter grid mounted to said housing on said insulating material.

4. The system of claim 1 further comprising means for mounting said detectors on said scanning electron microscope.

5. The system of claim 4 wherein said means for mounting comprises a collar mounted on said scanning electron microscope, a series of arms pivotably mounted to said collar and each of said housings mounted to an arm whereby said housings may be pivoted to move a focal point of said detectors to be coincident with a focal point of said electron beam.

6. The system of claim 4 further comprising a sealed chamber and wherein said means for mounting comprises arms protruding inwardly from chamber walls.

7. The system of claim 6 wherein each of said arms comprises means for pivotably moving a housing to thereby shift a focal point of said detectors to be coincident with a focal point of said electron beam.

8. The system of claim 1 further comprising means for establishing a potential difference between said ground grid and said energy filter grid.

9. A system for inspecting a specimen to provide topographical data for quantitative analysis comprising:
electron beam generating means for generating and focusing an electron beam on to a surface of said specimen to produce high energy backscatter electrons,
at least two detectors positioned at spaced locations and directed toward said specimen; and
means for each of said detectors to provide an energy filter such that said detectors collect said high energy backscatter electrons; wherein each of said detectors comprises a pair of substantially conformal concentric tapered conical members having a common central axis, an inner concentric member holding a scintillator and said means to provide an energy filter and an outer concentric member holding a ground grid, each of said conical members having an opening symmetric to said common central axis.

10. The system of claim 9 wherein each of said detectors comprises a housing, optical means positioned in said housing and directed toward said specimen, a scintillator mounted on said optical means and a ground grid positioned between said scintillator and said specimen.

11. The system of claim 10 wherein said energy filter comprises an electrostatic retarding potential grid positioned between said scintillator and said ground grid.

12. The system of claim 10 wherein said optical means comprises a fiberoptic bundle to provide an image of said sample.

13. The system of claim 9 wherein each of said detectors comprises a cylindrical hollow shell made of an insulative material metallic coatings on inner and outer surfaces of said shell, a ground grid mounted to said shell in electrical contact with said metallic inner coating and said means to provide an energy filter mounted in contact with said insulative material.

14. The system of claim 13 further comprising an insulative plug at one end of said shell and a scintillator positioned in said plug.

* * * * *